US012588557B2

(12) United States Patent
Gong et al.

(10) Patent No.: US 12,588,557 B2
(45) Date of Patent: Mar. 24, 2026

(54) MULTICHIP PACKAGES WITH 3D INTEGRATION

(71) Applicant: NXP USA, Inc., Austin, TX (US)

(72) Inventors: Zhiwei Gong, Chandler, AZ (US); Scott M Hayes, Chandler, AZ (US); Michael B. Vincent, Chandler, AZ (US); Leo van Gemert, Nijmegen (NL); Antonius Hendrikus Jozef Kamphuis, Nijmegen (NL); Wen Hung Huang, Kaosiung (TW)

(73) Assignee: NXP USA, INC., Austin, TX (US)

( * ) Notice: Subject to any disclaimer, the term of this patent is extended or adjusted under 35 U.S.C. 154(b) by 548 days.

(21) Appl. No.: 18/062,166

(22) Filed: Dec. 6, 2022

(65) Prior Publication Data

US 2024/0186303 A1 Jun. 6, 2024

(51) Int. Cl.
*H01L 25/16* (2023.01)
*H01L 21/48* (2006.01)
(Continued)

(52) U.S. Cl.
CPC ........ *H01L 25/165* (2013.01); *H01L 21/4857* (2013.01); *H01L 21/486* (2013.01);
(Continued)

(58) Field of Classification Search
CPC ....... H01L 23/538–5389; H01L 21/568; H01L 21/56; H01L 25/165; H01L 21/4857;
(Continued)

(56) References Cited

U.S. PATENT DOCUMENTS 6,680,529 B2 1/2004 Chen et al.
7,199,459 B2 4/2007 Pu et al.
(Continued)

FOREIGN PATENT DOCUMENTS

EP 0611129 A2 8/1994

OTHER PUBLICATIONS

Kumbhat, Nitech et al; "Chip-Last Fan-out Package with Embedded Power Ics in Ultra-Thin Laminates"; Research Gate, Conference Paper in Proceedings—Electronic Components and Technology Conference; 7 pages (May 2012).

*Primary Examiner* — Evan G Clinton

(57) ABSTRACT

A package is formed that encapsulates first and second components having respective first and second thickness differing from each other. Each component has lower surface provided with electrical contact pads and an upper surface opposite the lower surface. A volume of molding material encapsulates the first component. The package includes a set redistribution layers including a set of electrically-conductive interconnects surrounded by electrically-insulating material. The redistribution layers are disposed above the upper surface of the first component. The package includes one or more electrically conductive interconnects that pass through the redistribution layers to the lower surface of the first component; The second component is disposes at a location adjacent to the first component. A first portion of the second component is surrounded by the volume of molding material and a second portion of the second component is surrounded by one or more of the redistribution layers.

17 Claims, 4 Drawing Sheets

(51) Int. Cl.

| | |
|---|---|
| *H01L 21/56* | (2006.01) |
| *H01L 23/00* | (2006.01) |
| *H01L 23/14* | (2006.01) |
| *H01L 23/31* | (2006.01) |
| *H01L 23/498* | (2006.01) |
| *H01L 23/538* | (2006.01) |

(52) U.S. Cl.
CPC .......... *H01L 21/566* (2013.01); *H01L 23/145* (2013.01); *H01L 23/3128* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 23/5389* (2013.01); *H01L 24/16* (2013.01); *H01L 2224/16235* (2013.01); *H01L 2924/19041* (2013.01); *H01L 2924/19042* (2013.01); *H01L 2924/19043* (2013.01)

(58) Field of Classification Search
CPC ... H01L 21/486; H01L 21/566; H01L 23/145; H01L 23/3128; H01L 23/49816; H01L 23/49822; H01L 23/49838; H01L 23/5383; H01L 23/5386; H01L 24/16; H01L 2224/16235; H01L 2924/19041; H01L 2924/19042; H01L 2924/19043; H01L 23/13; H01L 2221/68345; H01L 2225/06524; H01L 25/0652; H01L 25/50; H01L 24/81; H01L 2221/68359

See application file for complete search history.

(56) References Cited

U.S. PATENT DOCUMENTS

| | | | |
|---|---|---|---|
| 10,608,125 | B1 | 3/2020 | Zhou |
| 10,779,413 | B2 | 9/2020 | Schwarz et al. |
| 11,133,264 | B2 | 9/2021 | Ghannam |
| 2009/0127686 | A1 | 5/2009 | Yang et al. |
| 2011/0068459 | A1* | 3/2011 | Pagaila .................. H01L 21/56 257/E23.141 |
| 2014/0144676 | A1 | 5/2014 | Chung et al. |
| 2016/0086930 | A1 | 3/2016 | Koey et al. |
| 2016/0316566 | A1 | 10/2016 | Sakai et al. |
| 2017/0053874 | A1 | 2/2017 | Renaud-Bezot |
| 2019/0304862 | A1 | 10/2019 | Lu |
| 2020/0091062 | A1 | 3/2020 | Yeon et al. |
| 2020/0364600 | A1 | 11/2020 | Elsherbini et al. |
| 2021/0134728 | A1* | 5/2021 | Rubin ................. H01L 21/4853 |
| 2021/0366801 | A1* | 11/2021 | Iwamoto ................. H01L 23/13 |

* cited by examiner

MULTICHIP PACKAGES WITH 3D INTEGRATION

FIELD OF THE INVENTION

Embodiments of the subject matter described herein relate to polymeric packages for semiconductor devices and other electronic components and methods of fabricating such packages.

BACKGROUND OF THE INVENTION

Semiconductor devices and other electronic devices are frequently assembled into packages to protect the devices from damage and to provide macroscopic electrical contacts. Packages can be made of various materials including polymers and ceramics. It can be desirable to assemble multiple devices within one package in order to reduce the volume required for various components in larger assemblies. It can also be desirable to interconnect multiple devices within a multi-chip package to save space and/or to improve device performance characteristics such as maximum clock speeds, power dissipation, and the like.

SUMMARY OF THE INVENTION

In an example embodiment, a method includes receiving a first component bonded to a carrier substrate via electrical contact pads; encapsulating the first component within a volume of molding material; releasing the molding material from the carrier substrate; forming a set of redistribution layers formed from electrically-insulating polymeric material; forming one or more electrically conductive interconnects that pass through the redistribution layers to the lower surface of the first component; forming a cavity that passes through the redistribution layers and into the volume of molding material; disposing a second component within the cavity; and forming one or more additional redistribution layers to fully encapsulate the second component.

The first component has a lower surface provided with the electrical contact pads and a secondary surface opposite the lower surface. The first component has a first thickness and the second component has a second component thickness that is different from than the first component thickness.

The set of redistribution layers is formed from layers of electrically-insulating polymeric material that are disposed above the lower surface of the first component when the lower surface of the first component oriented above the secondary surface of the first component. The cavity is formed in a location that is adjacent to the first component and the cavity has a depth that is greater than the first component thickness.

In another example embodiment, a method includes: receiving a first component bonded to a carrier substrate via electrical contact pads, forming a volume of sacrificial material adjacent to the first component; encapsulating the first component and the volume of sacrificial material within a volume of molding material; releasing the molding material from the carrier substrate; forming a first set of redistribution layers; disposing a second component within the cavity; and forming one or more electrically conductive interconnects that pass through the redistribution layers to the lower surface of the first component; and forming one or more additional redistribution layers to fully encapsulate the second component.

The first component has a lower surface provided with the electrical contact pads and a secondary surface opposite the lower surface. The second component having a second component thickness that is different from than the first component thickness The first set of redistribution layers are formed from electrically-insulating polymeric material that are disposed above the lower surface of the first component when the lower surface of the electronic component is oriented above the secondary surface of the component. The cavity has a depth that is greater than the first component thickness. The cavity is formed by selectively removing the first set of redistribution layers over the volume of sacrificial material, followed by removing the volume of sacrificial material.

In another example embodiment, a method includes forming a first set of redistribution layers including a first set of electrically-conductive interconnects surrounding a first layer of electrically-insulating polymeric material; forming additional redistribution layers having additional electrically-conductive interconnect layers above the first redistribution layer; disposing a first component within the additional redistribution layers; and disposing a second component above the additional redistribution layers.

The additional redistribution layers include one or more conductive paths that electrically connect the second component to external contact pads on a bottom surface of the package via interconnects within the first set of redistribution layers.

In another example embodiment, a package includes a first component and a second component. The first component has a first component thickness, and includes: a lower surface provided with electrical contact pads and an upper surface opposite the lower surface. The second component is disposed within the package at a location adjacent to the first component, and the second component has a second component thickness that is different from the first component thickness;

The package also includes a volume of molding material that encapsulates the first component; a set of redistribution layers; and one or more electrically conductive interconnects that pass through the redistribution layers to the lower surface of the first component.

The set of redistribution layers includes a first set of electrically-conductive interconnects surrounded by layers of electrically-insulating material; and the set of redistribution layers is disposed above the upper surface of the first component.

A first portion of the second component is surrounded by the volume of molding material and a second portion of the second component is surrounded by one or more of the redistribution layers.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
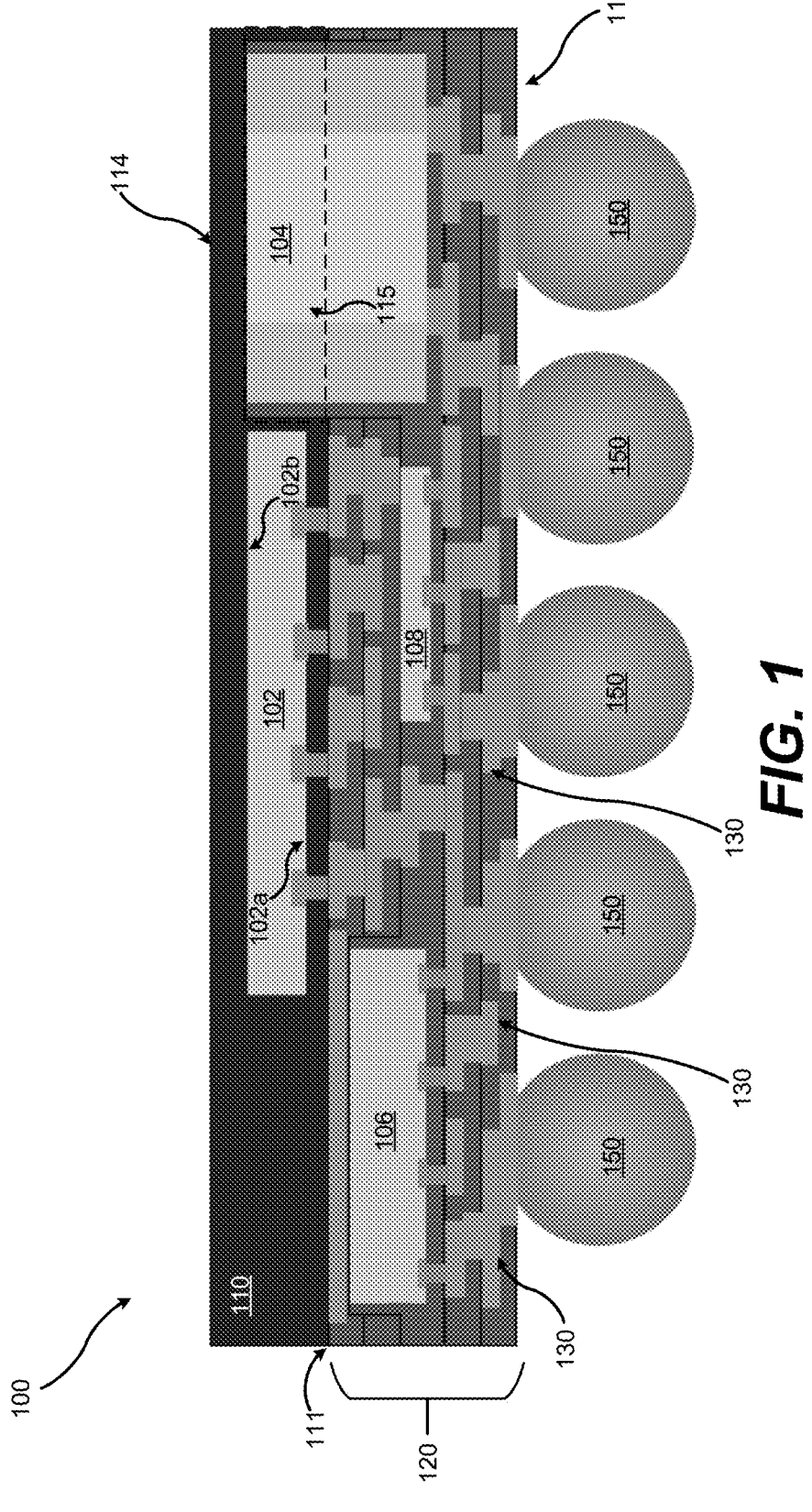
FIG. 1 is a cross-sectional illustration of an example multi-chip package according to embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Previous approaches to multichip packaging include so-called "2D or 2.5D integration" in which multiple devices, including components such semiconductor device die (or "chips") and/or other components are placed side-by side on a carrier and then interconnected by routing interconnects through interposers placed above or below the carrier. Other approaches referred to as "3D integration" can include stacking multiple devices on top of each other and interconnecting them using through-vias and/or other structures to interconnect the die and/or other components in different layers or tiers in a vertical arrangement.

Previous approaches including those described above can have disadvantages that can be addressed by applying methods disclosed herein to produce multichip packages. As an example, method for fabricating multichip packages according to embodiments herein enable the placement of semiconductor die and/or other components having different footprints and thicknesses in dense arrangements by allowing the die and/or other components are embedded in multiple packaging layers and/or across the layers.

Along these lines, FIG. 1 shows an example package 100 according to embodiments herein. Methods of fabricating the example package 100 and related multichip packages will be discussed further below in connection with FIG. 2 and FIG. 4. The example package 100 is assembled from a volume of molding material 110 that encapsulates a first component 102 (represented as a semiconductor device die, as a nonlimiting example and additional components 104, 106, 108 (semiconductor device die and/or other components). As shown these die or other components can be encapsulated at different depths and locations within one or more redistribution layers 120 through which electrically conductive interconnects 130 pass. Accordingly, embodiments herein can accommodate a wide range of component footprints and thickness by adjusting the number of redistribution layers 120, layer thickness, the routing of the interconnects 130, and depth of a cavity 115 as needed to accommodate a particular set of die and/or other components, as described below.

In one or more embodiments, interconnects 130 can be routed within redistribution layers 120 to provide connections between components within a single redistribution layer and interconnects 130 can also be routed to form connections between contacts areas of components disposed in one redistribution layer 120 to contacts areas of other components disposed within other redistribution layers 120. In the example of FIG. 1, the package 100 has a bottom surface 112 and a top surface 114. Interconnects 130 extend through the redistribution layers 120 to provide external contact areas that are provided with solder bumps 150 to allow the package 100 to be placed on a circuit board, for example. It will be understood that the package 100 is shown with solder bumps 150 on the bottom surface 112 for purposes of illustration and that embodiments herein are not limited to utilizing solder bumps or any other bonding technologies. Furthermore, it will be appreciated that packages according to embodiments herein are not limited to having electrical contacts on only one surface, or only type of electrical contacts. As one non-limiting example, a package may have solder pads on one surface and a solder ball array on a second surface.

As will be explained further below, redistribution layers 120 according to embodiments herein may be patterned and provided with interconnects 130 one layer at time to build up dense 3D structures incorporating multiple components within a layered redistribution structure formed in direct physical contact with the molding material 110. It will be understood that packages according to embodiments herein may include a greater or fewer number of components than pictured in FIG. 1 and that various arrangements of components with varying sizes and configurations are possible. For example, in embodiments herein a package may include components configured to be electrically coupled to contacts (i.e., interconnects 130) using any number of suitable methods, including as nonlimiting examples ball bonding, thermocompression bonding, flip chip bonding, solder reflow bonding, and so on as nonlimiting examples.

The bulk of multichip packages according to embodiments herein (e.g., the package 100 as shown in FIG. 1) can be formed entirely from polymeric materials (e.g., molding material 110 and additional polymeric materials forming redistribution layers 120 in contrast to other 3D integration or substrate embedding approaches that require the use of selectively hollowed out printed circuit boards with one or more core layers selectively removed to allow placement of components within voids in the circuit board(s). Advantageously, methods herein allow components having widely disparate sizes and thickness to be integrated within a single package. For instance, as shown in FIG. 1, it is not necessary that any particular component be disposed at the same depth as other any components, as in many previous approaches.

The molding material 110 and related molding materials herein can be any suitable material(s) including epoxy molding compounds (EMCs) which can include silica and/or other fillers, as nonlimiting examples. Redistribution layers 120 may be formed using any suitable materials, including, as nonlimiting examples: polyimide, epoxy, Polybenzoxazole (PBO), Ajinomoto build-up film (ABF) coating, or dry film materials. In one or more embodiments, one or more redistribution layers 120 are formed from the same material as the volume of molding material 110. In one or more embodiments, each redistribution layer 120 is formed from the same material as each other redistribution layer 120, while in one or more other embodiments, one or more different materials are used for certain redistribution layers 120.

As shown, the package 100 includes the component 102 (represented as a semiconductor device die, as a nonlimiting example) which is encapsulated by the molding material 110. The component 102 has a lower surface 102*a* that is provided with contact pads which can be bonded to electrically conductive interconnects as show and a secondary surface 102*b* above the lower surface 102*a*. It will be understood that component 102 is depicted with contacts on the lower surface 102*a* that are with cooper pillars suitable for interconnection with interconnects 130 of the redistribution layers 120 for the purposes of illustration and that, in one or more embodiments, a die such as the component 102 may instead be a die configured for ball bonding, solder reflow bonding, flip-chip bonding or any other suitable method. Furthermore, nothing herein is intended to limit die within packages according to embodiments herein to having contacts on only one surface of the die.

In the example of FIG. 1, the package 100 includes an additional component 104 which is much thicker than the component 102. The component 104 is illustrative of components such as a discrete resistors, capacitors, and inductors which may be significantly thicker than a semiconductor component. Such components can be incorporated into packages according to embodiments herein using techniques described further below in connection with FIG. 2, for example. As shown, the component 104 is partially disposed within a recess 115 (or cavity 115) formed in the molding material 110 which may also be partially filled by material used to form the redistribution layers 120 as will be described further below. The package 100 also incorporates the additional component 106 and 108 which can be encapsulated within one or more of the redistribution layers 120 and contacted by interconnects 130. Finally, the package 100 includes solder bumps 150 which are bonded to portions of the interconnects 130 that extend through the redistribution layers 120 to the bottom surface 112 of the package 110.

Figure 2:
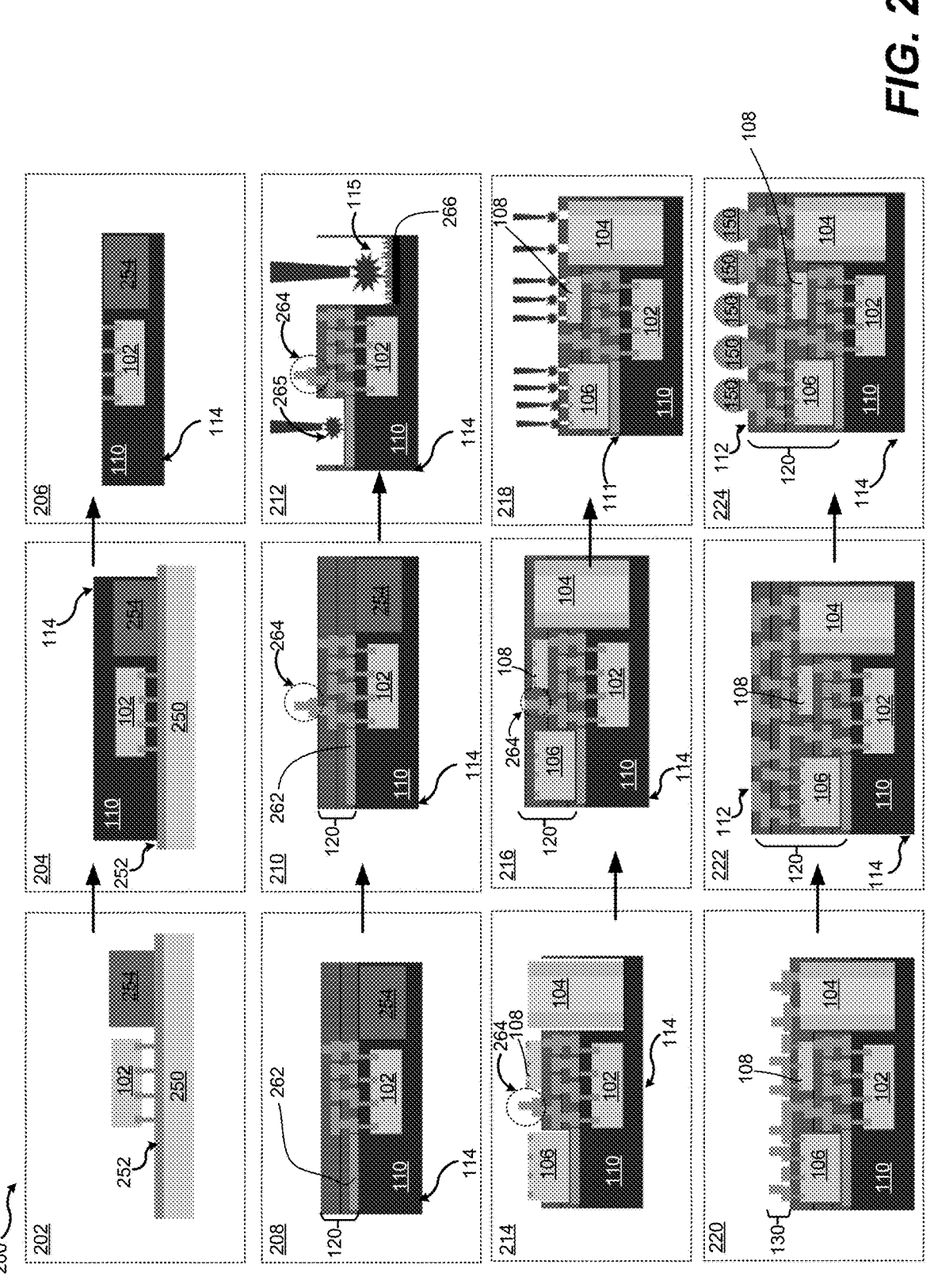
FIG. 2 is a cross-sectional illustration of steps in an example process for fabricating the multi-chip package of FIG. 1.

FIG. 2 illustrates steps in an example process 200 for fabricating a multichip package (e.g., the package 100) according to embodiments herein. Accordingly, the steps 202, 204, 206, 208, 210, 212, 214, 216, 218, 220, 222, and 224 of the process 200 are illustrated and described with reference to the package 100 and the components shown in FIG. 1.

First, at step 202, the component 102 is provided on a carrier substrate 250. A release film 252 is (optionally) disposed on the carrier substrate 250 between the substrate and the component 102 and can be used to allow the carrier substrate 250 to be removed as described in connection with step 206 below. As shown, at step 202, a volume of sacrificial material 254 is disposed on the carrier substrate 250 next to the component 102 in a location corresponding to the location of cavity 115 of FIG. 1).

At step 204, the molding material 110 is formed, encapsulating the component 102 and the sacrificial material 254. The molding material 110 may be formed by any suitable process. As nonlimiting examples, the molding material 110 may be dispensed as a liquid, powder, dry film, or paste and compression or injection molded around the carrier substrate 250 (or of a larger substrate of which the carrier substrate 250 is a portion), followed by a thermally-activated, chemically-activated, or light-activated curing process, or any other suitable process. The "top" surface of the molding material 110 will ultimately form the top surface 114 of the package 100 as shown in FIG. 1.

At step 206, the molding material 110, now containing the component 102 and sacrificial material 254 is separated from the carrier substrate 250 by removal of the release film 252. As illustrated at step 206, further processing may be performed with the molding material 110 and the component 102 inverted relative to the orientation depicted in steps 202 and 204.

At step 208, two redistribution layers 120 have been formed and provided with interconnects 130. It will be appreciated that the number of redistribution layers 120 and sequencing of the formation of those layers can vary depending on specific die to be incorporated in the resulting package. In this example an optional additional metallic structure. is present within the redistribution layer 120 nearest the molding material 110. In the example of FIG. 2, this etch stop 262 can be used in subsequent steps to aid in formation of a cavity for another part (i.e., the component 106 of FIG. 1) as will be described in connection with step 210 below. The redistribution layers 120 and the interconnects 130 within those layers as shown at step 208 in FIG. 2 can be formed in a sequential manner using any suitable processes. As one nonlimiting example, a first layer of interconnects 130 may be deposited and patterned on the exposed surface 111 of the molding material 110, followed by formation of a first redistribution layer 120 around them. This process may be repeated to build up subsequent redistribution layers 120 and the respective portion of the interconnects 120 within. As another nonlimiting example, the interconnects can be formed at least in part using electroplating processes or any other suitable methods.

At step 210 additional interconnects 130 are formed above the existing redistribution layers 120 (see the dashed area 264) prior to removal of the redistribution layers 120 above the etch stop 262.

At step 212, the redistribution layers 120 formed at step 208 are selectively removed from the area above the etch stop 262 in order to form a recess 265 for the component 106. In this example, the redistribution layers 120 are also selectively removed to form the recess 115 for the component 104. Any suitable etch process may be used to pattern the redistribution layers 120 for these purposes, including, but not limited to, wet chemical etching, plasma etching, laser etching and the like. In the example of step 210 a laser is used to form the cavity and the etch stop layer 262 is used to protect the underlying mold material 110 by virtue of not being etched by the laser (or being etched much more slowly than the material of the redistribution layer 120). In one or more embodiments, a similar etch stop layer is optionally used to aid formation of the cavity 115 for the component 104 and such an optional etch stop layer 266 is pictured at step 212. In such embodiments, the etch stop layer 266 is formed above the sacrificial material 254 at or before step 202.

At step 214, the component 104 and the component 106 are placed in the recess 265 and the recess 115, respectively (formed at step 212), In addition, component 108 is placed on top of the redistribution layers 120. In this example, both the component 106 and the component 108 are depicted having contact pads on their respective surfaces that are farthest from the top surface of the molding material 110 (which will become the top surface 114 of the package 100 as shown in FIG. 1).

At step 216, a third distribution layer 120 is formed, encapsulating the component 104, the component 106, and the component 108, as well as the interconnect 130 previously protruding from the redistribution layers 120 at steps 210-214. It will be understood that nothing herein is intended to require the specific arrangement of the component 102, 104, 106, and 108 pictured. Rather, the redistribution layers 120 and interconnects 130 can be formed to accommodate a wide range of die sizes and spatial arrangements. For example, any of the component 102, 104, 106, or 108 may be thicker or thinner than depicted or narrower or wider than depicted.

At step 218, the topmost redistribution layer(s) 120 directly above the components 104, 106, and 108 are selectively removed to expose electrical contacts on surfaces of each die. In this example, the components 102, 104, 106, and 108 are shown with contacts on their "top surfaces" (the surfaces closest to the surface 111 of the molding material 110). However, it will be appreciated that nothing herein is intended to limit embodiments to die with any particular orientation or contacts having any particular orientation.

At step 220, additional interconnects 130 are patterned and electrically coupled to the contact pads of the components 104, 106, and 108 as shown, using any suitable processes. As one nonlimiting example, a masking material (e.g., photoresist) may be deposited and patterned to create a template for electroplating of suitable metallic materials.

At step 222, the exposed interconnects 130 shown at step 220 are encapsulated redistribution material forming one or more additional redistribution layer 130. Electrical connections between the electrical contacts of different die may be made within the additional redistribution layers. As shown, a final redistribution layer 120 is formed that surrounds the topmost of the interconnects 130 while leaving conductive surfaces of those interconnects exposed.

At step 224, solder bumps 150 or any other suitable electrically conductive structures are bonded to the portions of the interconnects 130 left exposed at step 222, thereby completing the bottom surface 112 of the package 100. It will be appreciated that nothing herein is intended to limit packages according to embodiments herein to ball-grid array (BGA) packages or similar packages. For example, in one or more embodiments, a package such as the package 100, can instead be provided with bond pads or any other suitable contact configuration, for example, land-grid array (LGA) pads without solder bumps.

Figure 3:
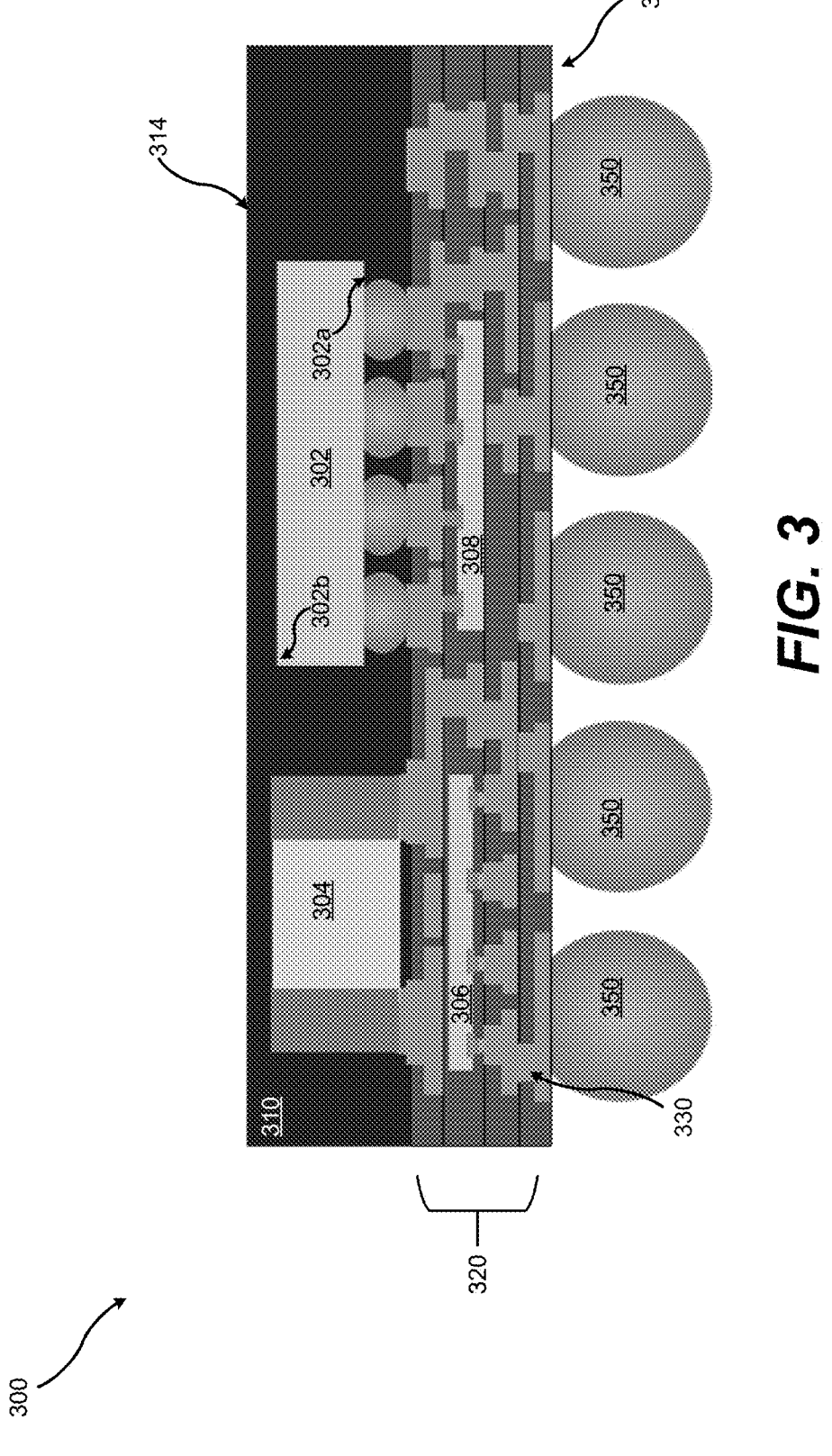
FIG. 3 is a cross-sectional illustration of another example multi-chip package according to embodiments herein.

FIG. 3 shows an example package 300 according to embodiments herein. Methods of fabricating the example package 300 and similar multichip packages will be discussed further below in connection with FIG. 4. Similarly to the example package 100 of FIG. 1, the example package 300 is assembled from a volume of molding material 310 (e.g., molding material 110) that encapsulates a first component 302 and additional components 304, 306, and 308. As shown, these die can be encapsulated at different depths and locations within one or more redistribution layers 320 (e.g., redistribution layers 120) through which electrically conductive interconnects 330 (e.g., interconnects 130) pass. In the example of FIG. 3, the package 300 has a bottom surface 312 and a top surface 314. Interconnects 330 extend through the redistribution layers 320 to provide external contact areas that are provided with solder bumps 350 to allow the package 300 to be placed on a circuit board, for example. It will be understood that the package 300 is shown with solder bumps 350 on the bottom surface 312 for purposes of illustration and that embodiments herein are not limited to utilizing solder bumps or any other bonding technologies. Furthermore, it will be appreciated that packages according to embodiments herein are not limited to having electrical contacts on only one surface.

Figure 4:
FIG. 4 is a cross-sectional illustration of steps in an example process for fabricating the multi-chip package of FIG. 2.

Multichip packages according to embodiments herein can be fabricated in a "die first" manner using the example process 100 and/or related processes. Multichip packages according to embodiments herein can also be fabricated a "component last" manner. FIG. 4 illustrates steps in an example "component last" process 400 for fabricating a multichip package (e.g., the package 300) according to embodiments herein. Accordingly, the steps 402, 404, 408, 410, 412, 141, 416, 418, and 420 of the process 400 are illustrated and described with reference to the package 300 and the components shown in FIG. 3.

First, at step 402, a first layer of the interconnects 330 (e.g., interconnects 130) is formed on a carrier substrate 450 (e.g., a carrier substrate 150).

At step 404, the first set of interconnects 330 is encapsulated within a first redistribution layer 320, followed by the formation of one or more additional redistribution layers 320 provided with additional interconnects 330, some of which can be coupled to the interconnects 330 of the first redistribution layer 320.

At step 406, an additional redistribution layer 320 is formed with additional interconnects 330. The additional redistribution layer 320 and interconnects 330 are configured to allow for placement and bonding of the component 306 and 308 at step 408.

At step 408, the component 306 is bonded to a portion of the interconnects formed at step 406, as shown. In this example, the component 306 is configured with copper pillars but any suitable contact configuration may be used including solder bumps or pads suitable for thermocompression bonding, application of conductive epoxy, etc. Meanwhile, the component 308 is disposed with contacts such as copper pillars facing upward to allow for connection to additional interconnects 330 in a subsequent step. In or more embodiments, a component such as the component 308 may have contacts on both a top surface and a bottom surface.

At step 410, the component 306 and the component 308 are encapsulated, along with the previously protruding interconnects 330 formed at step 308 within a third redistribution layer 320.

At step 412, a fourth redistribution layer 320 is formed that includes additional interconnects 330 which may be formed via an electroplating process into order to electrically contact the contact areas of the component 308 as shown.

At step 414, the components 302 and 304 are bounded to respective portions of the interconnects 330 left exposed at step 412. As examples, the component 302 is represented as a ball-grid-array package with solder bumps which have solder-bonded to the interconnects 330 beneath the balls and the component 304 is represented as a discrete component with large solder pads that have been solder-bonded to the interconnects 330 beneath the pads.

At step 416, the exposed components 302 and 304 are encapsulated in a volume of molding compound 310 (e.g., the molding compound 110). In one or more embodiments, step 416 or similar steps may be omitted, to yield a package in which die or and/or other components such as the components 302 and 304 are left exposed.

At step 418, the carrier substrate 450 is removed, exposing the bottom surface 112 of the package 300. Finally, at step 220, solder bumps 350 are bonded to the package 300 to form a ball grid array-type package.

It will be appreciated that, in one or more embodiments, a cavity (e.g., the cavity 115) spans both a volume of molding material (e.g., the volume of molding material 110) and one or more redistribution layers (e.g., redistribution layers 120). In one or more embodiments, a component such as a device die or other components in examples herein, spans multiple redistribution layers (e.g., the component 104 represented as a passive component such as a discrete resistor or inductor in FIG. 1 or the component 106 represented as a semiconductor device die).

In one or more embodiments, different components disposed within a set a of redistribution layers have thicknesses that span different numbers of redistribution layers (e.g., the component 106 and the component 108).

In one or more embodiments, a component (e.g., the component 308 represented as a device die in FIG. 3) is disposed within a set of redistribution layers is electrically coupled to interconnects "face down" using surface mount interconnection methods such as soldering, using electrically conductive adhesive (ECAs), using anisotropic conductive films (ACFs), and the like.

In one or more embodiments, a component such as the component 308 of FIG. 3 (or other components represented in examples herein) is disposed within a set of redistribution layers is electrically coupled to interconnects "face up" using known redistribution layer interconnection methods (e.g., etching of holes through one or more redistribution layers followed by deposition of additional metal material using sputtering, plating, or any other suitable method).

In one or more embodiments, one or more component or other components disposed within a set of redistribution layers is electrically coupled to interconnects "face down" as described above, while one or more other component or other components are electrically coupled to interconnects "face up" as described above within the same set of redistribution layers.

VARIOUS EXAMPLES

Features of embodiments may be understood by way of one or more of the following examples:

Example 1: a method of forming a package or a package formed by such a method that includes receiving a first component bonded to a carrier substrate via electrical contact pads; encapsulating the first component within a volume of molding material; releasing the molding material from the carrier substrate; forming a set of redistribution layers formed from electrically-insulating polymeric material; forming one or more electrically conductive interconnects that pass through the redistribution layers to the lower surface of the first component; forming a cavity that passes through the redistribution layers and into the volume of molding material; disposing a second component within the cavity; and forming one or more additional redistribution layers to fully encapsulate the second component.

The first component has a lower surface provided with the electrical contact pads and a secondary surface opposite the lower surface The first component has a first thickness and the second component has a second component thickness that is different from than the first component thickness.

The set of redistribution layers is formed from layers of electrically-insulating polymeric material that are disposed above the lower surface of the first component when the lower surface of the first component oriented above the secondary surface of the first component. The cavity is formed in a location that is adjacent to the first component and the cavity has a depth that is greater than the first component thickness.

Example 2: The method or package of Example 1, further including patterning a volume of sacrificial material adjacent to the first component; encapsulating the volume of sacrificial material within the volume of molding material; selectively removing the first set of redistribution layers above the volume of sacrificial material; and removing the volume of sacrificial material to form the cavity.

Example 3: The method or package of Example 1 or Example 2, further including depositing an etch stop material above a volume of sacrificial material. Removing the volume of sacrificial material includes perform an etching process that removes the sacrificial material at a first etch rate and removes the etch stop layer at a second etch rate that is lower than the first etch rate.

Example 4: The method or package or Example 3, in which the etching process is a laser ablation process.

Example 5: The method or package or of any of Examples 1-4, where the cavity is a first cavity and an etch stop layer is disposed within an aperture in one of the set of redistribution layer. This Example also includes forming a second cavity having a bottom surface defined by the etch stop material that is laterally separated from the first cavity, the bottom surface of the second cavity being located above the molding material and the lower surface of the first component; and disposing a third component within the second cavity.

Example 6: The method or package of Example 5, where the third component has a third component thickness that is different from at least one of the second component thickness and the first component thickness.

Example 7: The method or package or of any of Examples 1-6 further including, disposing third and fourth components at different depths within the set of redistribution layers.

Example 8: The method or package or of any of Examples 1-7, further including comprising disposing third and fourth components at different depths within the set of redistribution layers. The third component has a depth that spans a first number of redistribution layers and the fourth component had a depth that spans a second number of redistribution layers that is different from the first number of redistribution layers.

Example 9: The method or package or of any of Examples 1-8, including disposing a third component within one or more additional redistribution layers and electrically coupling the third component to interconnects within the set of redistribution layers.

Example 10: The method or package or of any of Examples 1-9, further including coupling a third component to interconnections within the set of redistribution layers via interconnects within one or more additional redistribution layers.

Example 11: a method of forming a package or a package formed by such a method that includes: receiving a first component bonded to a carrier substrate via electrical contact pads, forming a volume of sacrificial material adjacent to the first component; encapsulating the first component and the volume of sacrificial material within a volume of molding material; releasing the molding material from the carrier substrate; forming a first set of redistribution layers; disposing a second component within the cavity; and forming one or more electrically conductive interconnects that pass through the redistribution layers to the lower surface of the first component; and forming one or more additional redistribution layers to fully encapsulate the second component.

The first component has a lower surface provided with the electrical contact pads and a secondary surface opposite the lower surface. The second component having a second component thickness that is different from than the first component thickness. The first set of redistribution layers are formed from electrically-insulating polymeric material that are disposed above the lower surface of the first component when the lower surface of the electronic component is oriented above the secondary surface of the component. The cavity has a depth that is greater than the first component thickness. The cavity is formed by selectively removing the first set of redistribution layers over the volume of sacrificial material, followed by removing the volume of sacrificial material.

Example 12: a method of forming a package or a package formed by such a method that includes forming a first set of redistribution layers including a first set of electrically-conductive interconnects surrounding a first layer of electrically-insulating polymeric material; forming additional redistribution layers having additional electrically-conductive interconnect layers above the first redistribution layer; disposing a first component within the additional redistribution layers; and disposing a second component above the additional redistribution layers. The additional redistribution layers include one or more conductive paths that electrically connect the second component to external contact pads on a bottom surface of the package via interconnects within the first set of redistribution layers.

Example 13: The method or package of Example 12 further including forming a top surface of the package by encapsulating the second component within a volume of molding material.

Example 14: The method or package of Example 12 or Example 13 in which the second component is electrically coupled to the first component by interconnects that pass through the additional redistribution layers.

Example 15: The method or package of any of Examples 12-14 that includes disposing a third component within the additional redistribution layers. The first component is electrically coupled to interconnects within the additional redistribution layers via electrical contacts on a side of the first component facing away from the first set of redistribution layers. The third component is electrically coupled to interconnects within the first set of redistribution layers via electrical contacts on a side of the third component facing toward the first set of redistribution layers.

Example 16: The method or package of any of Examples 12-15 that includes disposing a third component within the additional redistribution layers in which the first component has a thickness spanning a first number of the additional redistribution layers; and the third component has a thickness spanning a second number of the additional redistribution layers that is different from the first number of the additional redistribution layers.

Example 17: The method or package of any of Examples 1-16 further including a third component disposed within the set of redistribution having a third thickness; and a fourth component disposed within the set of redistribution layers having a fourth thickness that is different from the third thickness.

Example 18 The method or package of any of Examples 1-17 a third component disposed within the set of redistribution layers that is electrically coupled to interconnects via electrical contacts disposed on a surface of the third component that faces toward the volume of molding material; and a fourth component disposed within the set of redistribution layers that is electrically coupled to interconnects via electrical contacts disposed on a surface of the fourth component that faces away from the volume of molding material.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method of fabricating a multi-component electronic device package, the method comprising:

receiving a first component having a first component thickness bonded to a carrier substrate via electrical contact pads, the first component having a lower surface provided with the electrical contact pads and a secondary surface opposite the lower surface;

encapsulating the first component within a volume of molding material;

releasing the molding material from the carrier substrate;

forming a set of redistribution layers from electrically-insulating polymeric material, wherein the set of redistribution layers is disposed above the lower surface of the first component when the lower surface of the first component is oriented above the secondary surface of the first component;

forming one or more electrically conductive interconnects that pass through the set of redistribution layers to the lower surface of the first component;

forming a cavity that passes through the set of redistribution layers and into the volume of molding material in a location that is adjacent to the first component, the cavity having a depth that is greater than the first component thickness;

disposing a second component within the cavity, the second component having a second component thickness that is different from the first component thickness; and forming one or more additional redistribution layers to fully encapsulate the second component.

2. The method of claim 1, further comprising:

patterning a volume of sacrificial material adjacent to the first component;

encapsulating the volume of sacrificial material within the volume of molding material;

selectively removing the set of redistribution layers above the volume of sacrificial material; and removing the volume of sacrificial material to form the cavity.

3. The method of claim 2, further comprising:

depositing an etch stop material above the volume of sacrificial material, wherein removing the volume of sacrificial material includes perform an etching process that removes the sacrificial material at a first etch rate and removes the etch stop layer at a second etch rate that is lower than the first etch rate.

4. The method of claim 3, wherein the etching process is a laser ablation process.

5. The method of claim 3, wherein the cavity is a first cavity and wherein the etch stop layer is disposed within an aperture in one of the set of redistribution layers; and wherein the method further comprises:

forming a second cavity having a bottom surface defined by the etch stop material that is laterally separated from the first cavity, the bottom surface of the second cavity being located above the molding material and the lower surface of the first component; and disposing a third component within the second cavity.

6. The method of claim 5, wherein the third component has a third component thickness that is different from at least one of the second component thickness and the first component thickness.

7. The method of claim 3, further comprising disposing third and fourth components at different depths within the set of redistribution layers.

8. The method of claim 3, further comprising disposing third and fourth components at different depths within the set of redistribution layers;

wherein the third component has a depth that spans a first number of redistribution layers of the set of redistribution layers, and the fourth component had a depth that spans a second number of redistribution layers of the set of redistribution layers that is different from the first number of redistribution layers.

9. The method of claim 1, further comprising disposing a third component within the one or more additional redistribution layers, and electrically coupling the third component to interconnects within the set of redistribution layers.

10. The method of claim 9, further comprising coupling the third component to the interconnections within the set of redistribution layers via interconnects within the one or more additional redistribution layers.

11. A method of fabricating a multi-component electronic device package, the method comprising:

receiving a first component having a first component thickness;

bonding the first component to a carrier substrate via electrical contact pads, the first component having a lower surface provided with the electrical contact pads and a secondary surface opposite the lower surface;

forming a volume of sacrificial material adjacent to the first component;

encapsulating the first component and the volume of sacrificial material within a volume of molding material;

releasing the molding material from the carrier substrate;

forming a first set of redistribution layers from electrically-insulating polymeric material, wherein the first set of redistribution layers is disposed above the lower surface of the first component when the lower surface of the first component is oriented above the secondary surface of the first component;

forming one or more electrically conductive interconnects that pass through the first set of redistribution layers to the lower surface of the first component;

forming a cavity that passes through the first set of redistribution layers and into the volume of molding material in a location that is adjacent to the first component by:

selectively removing the first set of redistribution layers over the volume of sacrificial material, followed by removing the volume of sacrificial material; wherein the cavity has a depth that is greater than the first component thickness;

disposing a second component within the cavity, the second component having a second component thickness that is different from the first component thickness; and forming one or more additional redistribution layers to fully encapsulate the second component.

12. A method of fabricating a multi-component electronic device package, the method comprising:

forming a first redistribution layer including a first set of electrically-conductive interconnects surrounded by a first layer of electrically-insulating polymeric material, wherein the first layer of electrically-insulating polymeric material defines a bottom surface of the electronic device package, and the first set of electrically-conductive interconnects is exposed at the bottom surface;

forming additional redistribution layers having additional electrically-conductive interconnect layers above the first redistribution layer;

disposing a first component within the additional redistribution layers;

disposing a second component above the additional redistribution layers; and disposing a third component within the additional redistribution layers, wherein the additional redistribution layers include one or more conductive paths that electrically connect the second component to the first set of electrically-conductive interconnects within the first redistribution layer, wherein the first component has a first thickness spanning a first number of the additional redistribution layers, and wherein the second component has a second thickness that is different from the first thickness.

13. The method of claim 12, further comprising disposing a third component within the additional redistribution layers;

wherein the first component is electrically coupled to interconnects within the additional redistribution layers via electrical contacts on a side of the first component facing away from the first redistribution layer; and wherein the third component is electrically coupled to interconnects within the first set of redistribution layers via electrical contacts on a side of the third component facing toward the first redistribution layer.

14. The method of claim 12, further comprising:

encapsulating the second component in a volume of molding compound.

15. The method of claim 12, further comprising:

disposing a fourth component above the additional redistribution layers adjacent to the second component, wherein the fourth component has a third thickness that is different from the second thickness.

16. The method of claim 12, wherein the first component is electrically coupled to interconnects within the additional redistribution layers via electrical contacts on a side of the first component facing away from the first redistribution layer.

17. The method of claim 16, wherein the second component is electrically coupled to the first component through the interconnects within the additional redistribution layers.

* * * * *